(12) United States Patent
Mohan

(10) Patent No.: US 7,209,006 B1
(45) Date of Patent: Apr. 24, 2007

(54) DIFFERENTIAL AMPLIFIER WITH INCREASED COMMON MODE LOOP GAIN AT LOW FREQUENCIES

(75) Inventor: Jitendra Mohan, Santa Clara, CA (US)

(73) Assignee: National Semiconductor Corporation, Sunnyvale, CA (US)

( * ) Notice: Subject to any disclaimer, the term of this patent is extended or adjusted under 35 U.S.C. 154(b) by 125 days.

(21) Appl. No.: 11/161,506

(22) Filed: Aug. 5, 2005

(51) Int. Cl.
*H03F 3/45* (2006.01)

(52) U.S. Cl. .................. 330/259; 330/258; 330/261

(58) Field of Classification Search ................ 330/258, 330/259, 261
See application file for complete search history.

(56) References Cited

U.S. PATENT DOCUMENTS

| | | | | |
|---|---|---|---|---|
| 4,272,728 A | * | 6/1981 | Wittlinger | 330/253 |
| 5,475,323 A | * | 12/1995 | Harris et al. | 327/67 |
| 5,847,607 A | * | 12/1998 | Lewicki et al. | 330/258 |
| 6,525,613 B2 | * | 2/2003 | Cyrusian | 331/17 |
| 7,091,783 B2 | * | 8/2006 | Bailey et al. | 330/252 |

* cited by examiner

*Primary Examiner*—Patricia Nguyen
(74) *Attorney, Agent, or Firm*—Vedder, Price, Kaufman & Kammholz, P.C.

(57) ABSTRACT

A differential amplifier circuit with feedback to increase common mode loop gain at low frequencies.

12 Claims, 3 Drawing Sheets

DIFFERENTIAL AMPLIFIER WITH INCREASED COMMON MODE LOOP GAIN AT LOW FREQUENCIES

BACKGROUND OF THE INVENTION

The present invention relates to differential amplifier circuits, and in particular, to fully differential amplifier circuits with common mode feedback loops.

In many of today's complex electronic systems, reduction of noise is critical to achieving good circuit performance. One common technique is to use fully differential operational amplifiers to reduce sensitivity to power supply noise. Since both the input and output connections and signals are differential, a circuit is generally required to set the common mode of the output signal independently of the common mode of the input signal. This is often achieved by adding a common mode feedback loop that senses the output common mode and compares it to a desired value. The resulting common mode feedback error signal CMFB is fed back to the operational amplifier. Such a common mode loop also results in improvement in the power supply rejection ratio (PSRR). In most cases, the power supply noise is common mode in nature and, therefore, can be corrected by such a common mode loop configuration. Ideally, the differential and common mode signal paths will have similar open loop transfer functions thereby allowing the common mode loop to cancel noise introduced via the power supply connections.

However, in principal, this is often not true for at least two reasons. First, such a common mode loop usually requires an additional transfer function pole and needs to be compensated more heavily, thereby reducing its bandwidth. Second, when a small common mode signal is applied somewhere inside the loop, it gets amplified by the operational amplifier and the now gained up signal appears at the gate electrodes of the pair of differential amplifier transistors. Since the loop is common mode, these transistors do not amplify the signal, but simply pass it on to the drain of the tail current source. This results in modulation of the voltage at the drain electrode of the tail current source, thereby causing a common mode signal of a polarity opposite to the applied disturbance to become injected into the first stage of the loop. This, in turn, causes a reduction in loop gain at lower frequencies (which is dominated by the channel conductance of the current source), plus an additional phase shift added to the loop transfer function thereby causing further problems in stabilizing the loop.

SUMMARY

In accordance with the presently claimed invention, a differential amplifier circuit includes internal feedback to increase common mode loop gain at low frequencies.

In accordance with one embodiment of the presently claimed invention, a differential amplifier includes tail current source circuitry, differential amplifier circuitry, bias circuitry and control feedback circuitry. The tail current source circuitry is responsive to at least a first bias signal by providing a second bias signal. The differential amplifier circuitry is coupled to the tail current source circuitry and responsive to at least the second bias signal, third and fourth bias signals, and a differential input signal by providing a differential output signal. The bias circuitry is coupled to the differential amplifier circuitry and responsive to at least a fifth bias signal by providing the third and fourth bias signals. The control feedback circuitry is coupled to the tail current source circuitry and the bias circuitry, and responsive to at least the second bias signal by providing at least the fifth bias signal, wherein at least the fifth bias signal is modulated in relation to a modulation of the second bias signal such that the third and fourth bias signals are modulated in an inverse relation to the second bias signal modulation.

In accordance with another embodiment of the presently claimed invention, a differential amplifier includes tail current source means, differential amplifier means, bias means and control feedback means. The tail current source means is for receiving at least a first bias signal and in response thereto providing a second bias signal. The differential amplifier means is for receiving at least the second bias signal, third and fourth bias signals, and a differential input signal and in response thereto providing a differential output signal. The bias means is for receiving at least a fifth bias signal and in response thereto providing the third and fourth bias signals. The control feedback means is for receiving at least the second bias signal and in response thereto providing at least the fifth bias signal, wherein at least the fifth bias signal is modulated in relation to a modulation of the second bias signal such that the third and fourth bias signals are modulated in an inverse relation to the second bias signal modulation.

In accordance with still another embodiment of the presently claimed invention, a differential amplifier includes tail current source circuitry, differential amplifier circuitry and control feedback circuitry. The tail current source circuitry is responsive to at least a first bias signal by providing a second bias signal. The differential amplifier circuitry is coupled to the tail current source circuitry and responsive to at least the second bias signal, a third bias signal and a differential input signal by providing a differential output signal with a common mode signal component. The control feedback circuitry is coupled to the tail current source circuitry and the differential amplifier circuitry, and responsive to at least the second bias signal by providing at least the third bias signal, wherein at least the third bias signal is modulated in relation to a modulation of the second bias signal such that the common mode signal component of the differential output signal remains substantially constant notwithstanding the second bias signal modulation.

In accordance with yet another embodiment of the presently claimed invention, a differential amplifier includes tail current source means, differential amplifier means and control feedback means. The tail current source means is for receiving at least a first bias signal and in response thereto providing a second bias signal. The differential amplifier means is for receiving at least the second bias signal, a third bias signal and a differential input signal and in response thereto providing a differential output signal with a common mode signal component. The control feedback means is for receiving at least the second bias signal and in response thereto providing at least the third bias signal, wherein at least the third bias signal is modulated in relation to a modulation of the second bias signal such that the common mode signal component of the differential output signal remains substantially constant notwithstanding the second bias signal modulation.

DETAILED DESCRIPTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context of the discussion, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators.

Figure 1:
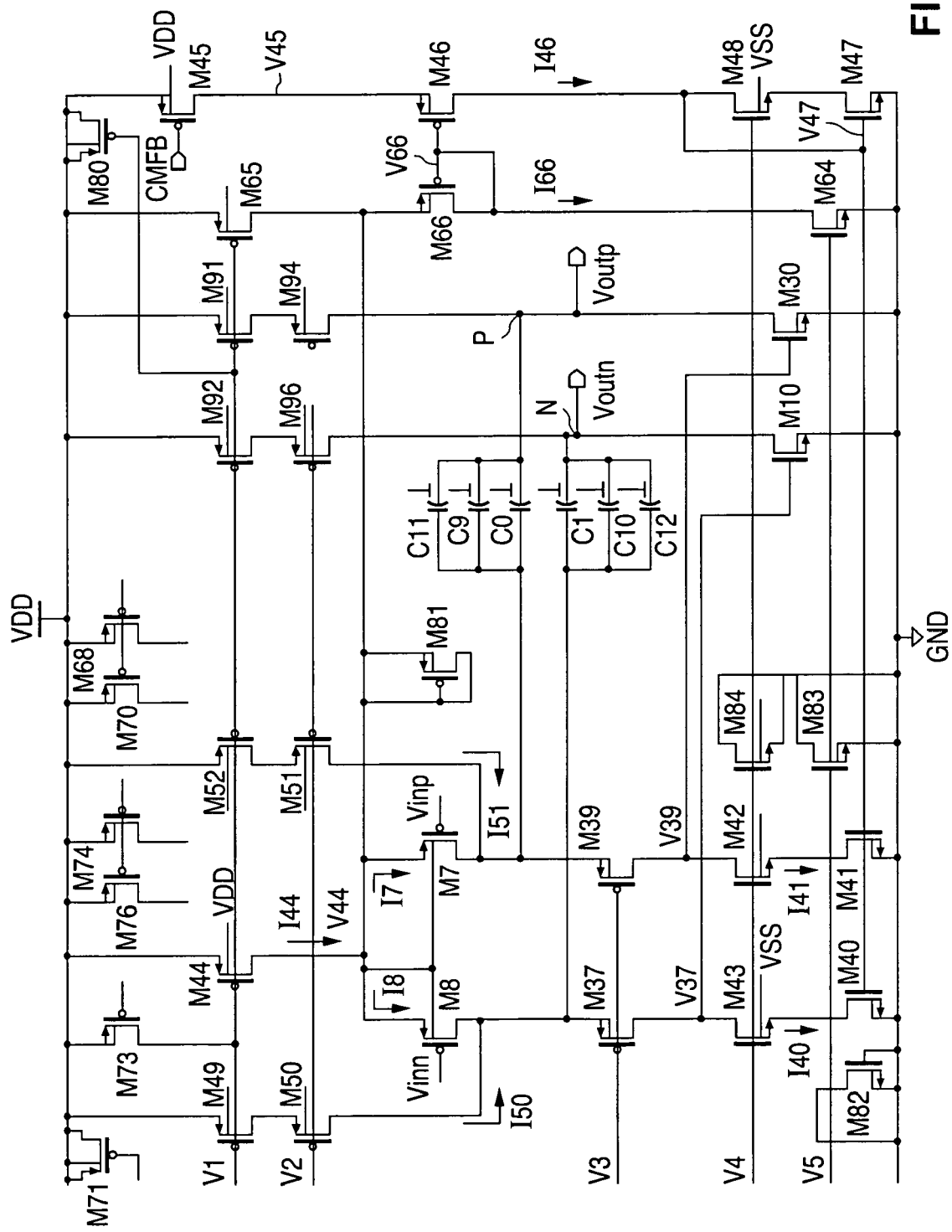
FIG. 1 is a schematic diagram of a differential amplifier in accordance with one embodiment of the presently claimed invention.

Referring to FIG. 1, a differential amplifier in accordance with one embodiment of the presently claimed invention has a differential input stage implemented with P-type metal oxide semiconductor field effect transistors (P-MOSFETs) M7 and M8 interconnected as shown. A tail current source in the form of P-MOSFET M44 supplies tail current I44. This produces a bias voltage V44 at the junction of the drain electrode of transistor M44 and the source electrodes of transistors of M7 and M8.

Transistors M37 and M39, and N-type MOSFETs M40, M41, M42 and M43 provide biasing at the drain electrodes of differential transistors M7 and M8. Transistors M49, M50, M51 and M52 provide additional biasing at the drain electrodes of transistors M7 and M8. Fixed biasing voltages V1 and V2 bias these transistors M49, M50, M51, M52, which provide currents I50 and I51. Fixed bias voltages V3 and V4 provide bias voltages for transistors M37, M39, M42 and M43.

The differential input signal phases VINP and VINN are applied to the gate electrodes of transistors M7 and M8, respectively. This results in differential output signal phases VOUTP and VOUTN being provided at the drain electrodes of transistors M7 and M8, respectively. These output signal phases VOUTP, VOUTN are made available at node P (junction of drain electrodes of transistors M94 and M30) and node N (junction of drain electrodes of transistors M96 and M10), respectively. Transistors M91 and M92 are biased by bias voltage V1, transistors M94 and M96 are biased by bias voltage V2, and transistors M10 and M30 are biased by voltages V37 and V39 at the drain electrodes of transistors M37 and M43, and transistors M39 and M42, respectively.

Bias voltage V44 is also applied at the source electrode of transistor M66 which is the input of a signal replication circuit in the form of a voltage replication circuit formed by transistors M66 and M46. This bias voltage V44 is shifted by the level shifting action of transistor M66 to produce voltage V66 at the gate electrodes of transistors M66 and M46.

Similarly, transistor M46 shifts this voltage V66 to produce voltage V45 at the interconnected drain and source electrodes of transistors M45 and M46, respectively. The combination of voltage V45 and common mode feedback error signal CMFB at the drain and gate electrodes of transistor M45 establish the drain current of transistor M45 which is also current I46 through transistor M46. This current I46 causes a biasing voltage V47 to appear at the gate electrode of transistor M47. This bias voltage V47, in turn, provides the bias for transistors M40 and M41. Hence, it is this biasing voltage V47 that determines currents I40 and I41 within the input differential stage.

In the event that a common mode signal develops within the loop, as a result of a common mode disturbance as discussed above (e.g., from a power supply related noise signal or a residual common mode signal coupled in through external feedback elements), and the bias voltage V44 developed at the drain electrode of the tail current source transistor M44 is modulated, this modulated voltage V44, in turn, modulates level-shifted voltages V66 and V45, and therefore current I46, in a like manner. Hence, the main tail current source, transistor M44, and the common mode feedback current source, transistor M45, see similar modulations of the voltages at their respective drain electrodes. Similarly, this causes modulation of the bias voltage V47 applied to the gate electrodes of transistors M40 and M41. The inverting action of transistors M40 and M41, i.e., the increasing and decreasing of currents I40 and I41 in response to decreasing and increasing of the bias voltage V47, respectively, counteracts the effects of the modulation of the bias voltage V44. In other words, modulation of the bias voltage V44 is compensated by counteracting the modulation of biasing currents I40 and I41. As a result, this causes the DC loop gain to be restored and excess phase shift to be removed, thereby producing a transfer function which is not affected by the otherwise limited output impedance at the drain electrode of the tail current source transistor M44. Accordingly, this allows the tail current source transistor M44 to be implemented with a transistor having minimum channel length, which reduces its area and, therefore, its parasitic capacitance. This last result, in particular, results in improved high frequency PSRR.

An additional benefit is that the common mode voltage at nodes P and N, established by the action of transistors M91, M92, M94, M96, M10 and M30, is also maintained at a more substantially constant value.

Figure 2:
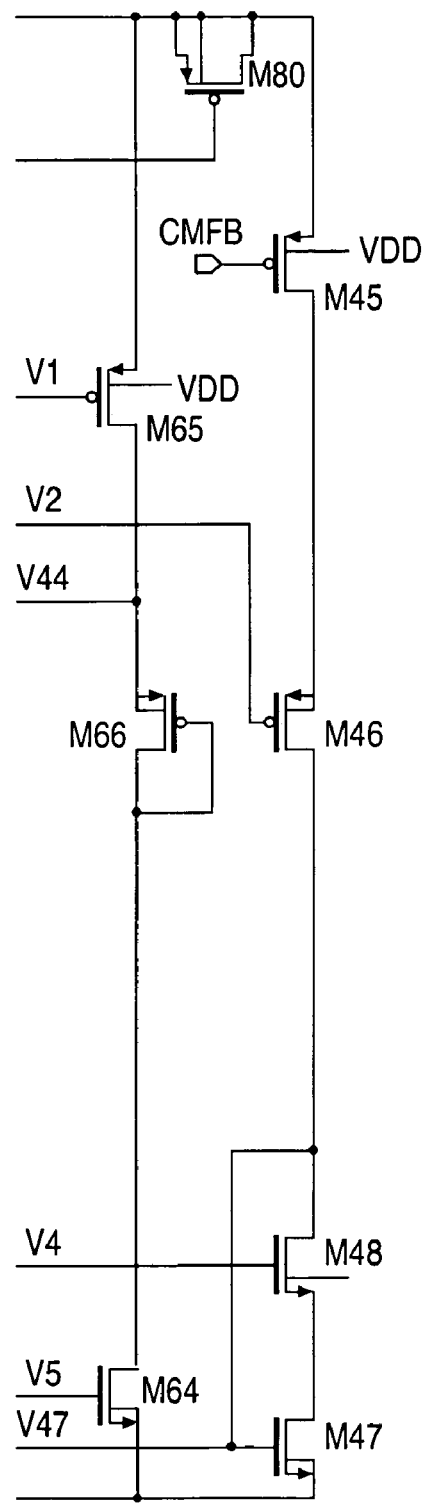
FIG. 2 is a schematic diagram of a conventional technique for providing a bias voltage for the differential input stage of the circuit of FIG. 1.

Referring to FIG. 2, a conventional implementation of the common mode feedback circuitry includes connection of transistor M66 as a diode with no connection to transistor M46 which is biased by bias voltage V2 and is solely responsible for producing the feedback biasing voltage V47. As a result, modulation of the bias voltage V44 is not used to produce a compensating signal for feeding back and counteracting the effects of such modulation. (Indeed, with such circuit connections, the circuit branch containing transistors M64, M65 and M66 becomes of no use and can be omitted.)

Figure 3:
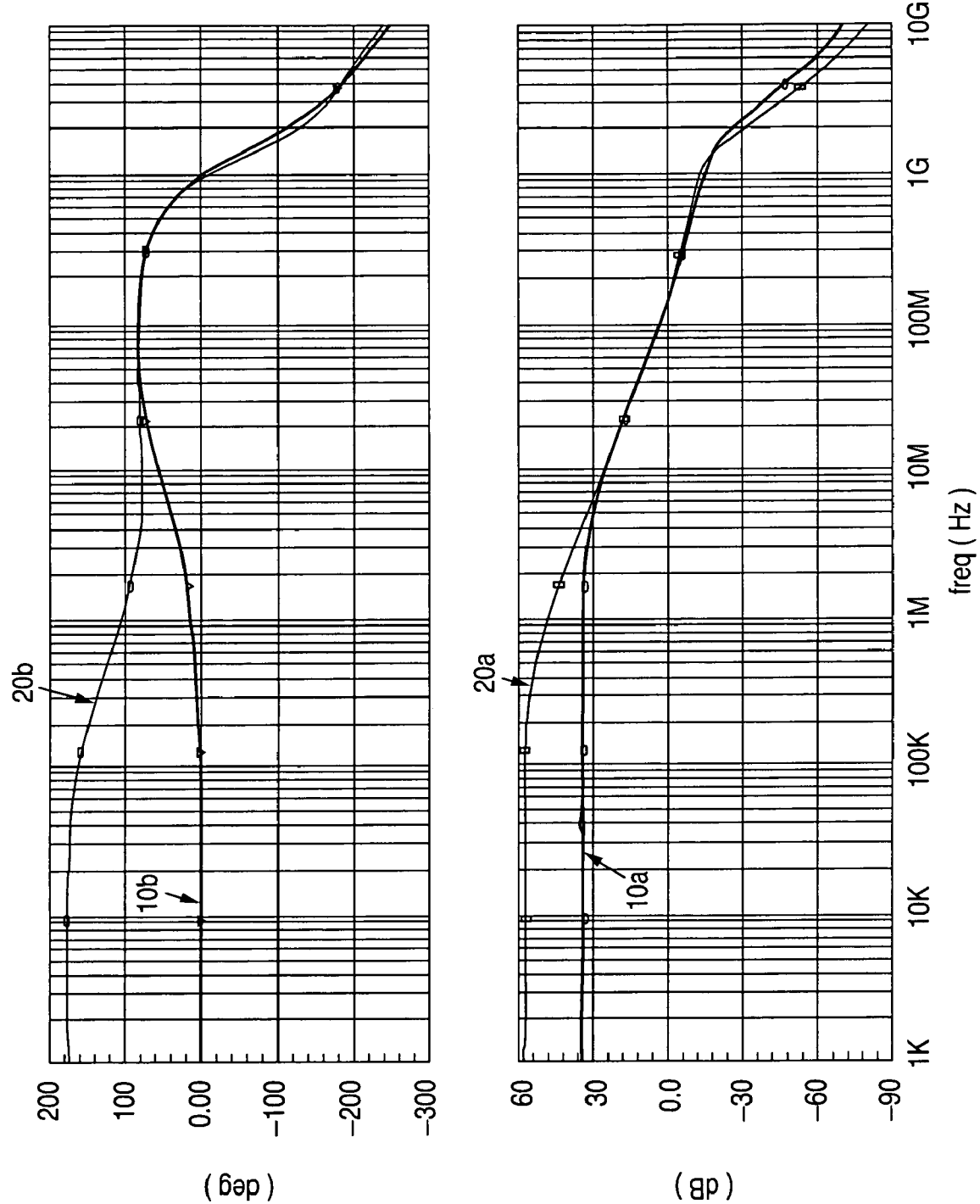
FIG. 3 are graphs comparing the gain and phase characteristics of a conventional differential amplifier and a differential amplifier in accordance with one embodiment of the presently claimed invention.

Referring to FIG. 3, a simulation of the circuitry of FIG. 1 exhibited improvements in gain and phase shift as shown. For example, using the conventional feedback circuit of FIG. 2, gain 10A and phase shift 10B are realized. In contrast, using the circuitry of FIG. 1, gain 20A and phase shift 20B characteristics are realized. Hence, as can be seen, gain is increased and phase sift is removed at the lower frequencies.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a differential amplifier, comprising:
   tail current source circuitry responsive to at least a first bias signal by providing a second bias signal;
   differential amplifier circuitry coupled to said tail current source circuitry and responsive to at least said second bias signal, third and fourth bias signals, and a differential input signal by providing a differential output signal;
   bias circuitry coupled to said differential amplifier circuitry and responsive to at least a fifth bias signal by providing said third and fourth bias signals; and
   control feedback circuitry coupled to said tail current source circuitry and said bias circuitry, and responsive to at least said second bias signal by providing at least said fifth bias signal, wherein at least said fifth bias signal is modulated in relation to a modulation of said second bias signal such that said third and fourth bias signals are modulated in an inverse relation to said second bias signal modulation.

2. The apparatus of claim 1, wherein said differential amplifier circuitry comprises:
   a first circuit branch responsive to at least a portion of said second bias signal, said third bias signal, and a first portion of said differential input signal by providing a first portion of said differential output signal; and
   a second circuit branch responsive to at least another portion of said second bias signal, said fourth bias signal, and a second portion of said differential input signal by providing a second portion of said differential output signal.

3. The apparatus of claim 1, wherein said bias circuitry comprises first and second circuit branches responsive to at least said fifth bias signal by providing said third and fourth bias signals, respectively.

4. The apparatus of claim 1, wherein said control feedback circuitry comprises signal replication circuitry responsive to at least said second bias signal by providing at least said third bias signal such said third bias signal modulation is at least approximately proportional to said second bias signal modulation.

5. The apparatus of claim 4, wherein said signal replication circuitry comprises voltage replication circuitry.

6. An apparatus including a differential amplifier, comprising:
   tail current source means for receiving at least a first bias signal and in response thereto providing a second bias signal;
   differential amplifier means for receiving at least said second bias signal, third and fourth bias signals, and a differential input signal and in response thereto providing a differential output signal;
   bias means for receiving at least a fifth bias signal and in response thereto providing said third and fourth bias signals; and
   control feedback means for receiving at least said second bias signal and in response thereto providing at least said fifth bias signal, wherein at least said fifth bias signal is modulated in relation to a modulation of said second bias signal such that said third and fourth bias signals are modulated in an inverse relation to said second bias signal modulation.

7. An apparatus including a differential amplifier, comprising:
   tail current source circuitry responsive to at least a first bias signal by providing a second bias signal;
   differential amplifier circuitry coupled to said tail current source circuitry and responsive to at least said second bias signal, a third bias signal and a differential input signal by providing a differential output signal with a common mode signal component; and
   control feedback circuitry coupled to said tail current source circuitry and said differential amplifier circuitry, and responsive to at least said second bias signal by providing at least said third bias signal, wherein at least said third bias signal is modulated in relation to a modulation of said second bias signal such that said common mode signal component of said differential output signal remains substantially constant notwithstanding said second bias signal modulation.

8. The apparatus of claim 7, wherein said differential amplifier circuitry comprises first and second circuit branches each of which includes:
   amplifier circuitry coupled to said tail current source circuitry and responsive to at least a portion of said second bias signal, a respective one of first and second branch bias signals, and a portion of said differential input signal by providing a portion of said differential output signal; and
   bias circuitry coupled to said control feedback circuitry and said amplifier circuitry, and responsive to at least said third bias signal by providing said respective one of said first and second branch bias signals.

9. The apparatus of claim 8, wherein said bias circuitry comprises first and second circuit branches responsive to at least said third bias signal by providing said first and second branch bias signals, respectively.

10. The apparatus of claim 7, wherein said control feedback circuitry comprises signal replication circuitry responsive to at least said second bias signal by providing at least said third bias signal such said third bias signal modulation is proportional to said second bias signal modulation.

11. The apparatus of claim 10, wherein said signal replication circuitry comprises voltage replication circuitry.

12. An apparatus including a differential amplifier, comprising:
   tail current source means for receiving at least a first bias signal and in response thereto providing a second bias signal;
   differential amplifier means for receiving at least said second bias signal, a third bias signal and a differential input signal and in response thereto providing a differential output signal with a common mode signal component; and
   control feedback means for receiving at least said second bias signal and in response thereto providing at least said third bias signal, wherein at least said third bias signal is modulated in relation to a modulation of said second bias signal such that said common mode signal component of said differential output signal remains substantially constant notwithstanding said second bias signal modulation.

\* \* \* \* \*